United States Patent [19]

Szajda

[11] Patent Number: 5,546,041
[45] Date of Patent: Aug. 13, 1996

[54] FEEDBACK SENSOR CIRCUIT

[75] Inventor: Kenneth S. Szajda, Arlington, Mass.

[73] Assignee: Massachusetts Institute of Technology, Cambridge, Mass.

[21] Appl. No.: 102,620

[22] Filed: Aug. 5, 1993

[51] Int. Cl.$^6$ .................................................. H03K 17/00
[52] U.S. Cl. ...................... 327/512; 327/513; 327/509; 327/514; 327/538; 307/650; 323/315
[58] Field of Search ................................. 307/491, 310, 307/308, 494, 356, 359, 559, 650, 651, 355, 291, 241; 328/1, 2, 3; 302/355, 291, 241; 323/315, 316; 327/512, 513, 509, 514, 538, 541, 124, 77, 78, 82

[56] References Cited

U.S. PATENT DOCUMENTS

| | | | |
|---|---|---|---|
| 4,100,436 | 7/1978 | van de Plassche | 327/538 |
| 4,165,642 | 8/1979 | Lipp | 328/3 |
| 4,346,291 | 8/1982 | Chapel, Jr. et al. | 322/509 |
| 4,625,128 | 11/1986 | Boeckmann | 307/310 |
| 4,657,658 | 4/1987 | Sibbald | 328/1 |
| 4,772,866 | 9/1988 | Willens | 338/225 D |
| 4,779,161 | 10/1988 | DeShazo | 307/310 |
| 5,030,849 | 7/1991 | Brokaw | 307/310 |

OTHER PUBLICATIONS

Thermal Sensors Based On Transistors, Gerard C. M. Meijer, Sensor and Actuators, 1986, pp. 103–125.
Measurment Of The Temperature Dependence . . . , Gerard C. M. Meijer and Kees Vingerling, IEEE Journal, vol. SC–15, pp. 237–240, Apr. 1980.
An IC Temperature Transducer With An Intrinsic Reference, Gerard C. M. Meijer, IEEE Journal of Solid–State Circuits, vol. SC–15, N3, pp. 370–373, Jun. 1980.
A Three–Terminal Integrated Temperature Transducer With Microcomputer Interfacing, Gerard C. M. Keijer, Van Gelder, V. Nooder, J. Van Drecht and H. Kerkvliet, Sensors and Actuators vol. 18, pp. 195–206, 1989.
A Low–Power Easy–To–Calibrate Temperature Transducer, Gerard C. M. Meijer, IEEE Journal of Solid–State Circuits, vol. SC–17, No. 3, pp. 609–613, Jun. 1982.
An Integrated Micropower Low–Voltage Temperature–Controlled Oscillator, David Van Maaren, Jan Klijn, and Gerard C. M. Meijer, IEEE Journal of Solid–State Circuits, vol. SC–17, No. 6, pp. 1197–1201, Dec. 1982.

Primary Examiner—Timothy P. Callahan
Assistant Examiner—Dinh T. Le
Attorney, Agent, or Firm—Wolf, Greenfield & Sacks P.C.

[57] ABSTRACT

A circuit for sensing a parameter, such as temperature, has a single current source and a mismatched differential pair for providing two different currents at a desired current ratio. Each current is provided to a current control element and a sensing element, each of which may be diodes. An operational amplifier closes the loop and feeds back a signal from the input of the current control elements to the differential pair to hold the desired current ratio constant. Chopper circuitry is employed with the amplifier to reduce the offset and low frequency noise contribution of the amplifier.

37 Claims, 3 Drawing Sheets

FEEDBACK SENSOR CIRCUIT

This invention was made with government support under Grant Number NIH-5P01-CA31303 awarded by the National Institute of Health. The government has certain rights in the invention.

FIELD OF THE INVENTION

This invention relates to a feedback circuit for sensing and measuring.

BACKGROUND OF THE INVENTION

Sensing circuitry, such as circuitry used to sense temperature, typically has a sensing element and excitation circuitry. The maximum resolution of such sensing circuitry depends on the physical noise limits of the sensing element, and on limitations of the excitation circuitry.

Integrated silicon temperature sensors are currently under investigation because it would be desirable to have an integrated sensor manufactured on the same substrate as signal processing circuitry. Using a single chip is advantageous because of the small size and because the circuitry can perform on-chip processing prior to transmission of data off-chip. Most integrated temperature sensors use a p-n diode as the sensing element, since these diodes can be easily manufactured in a standard bipolar or CMOS process, while it is difficult to manufacture good thermistor-type materials and circuitry on the same wafer using standard processing techniques. These diodes are also preferable because they exhibit a temperature sensitivity of about −2 mV/° C., which is larger than most other circuit elements.

One measuring approach is to provide a known current source and a diode in series, and to measure the voltage across the diode. A relationship can be derived in which the diode voltage is expressed as a number of parameters which are not sensitive to temperature and the logarithm of the temperature. This straightforward approach has two problems: first, the inverse relationship is complex and nonlinear, thus complicating the signal processing as well as the sensor calibration; and second, there is a large turn-on voltage of the diode (about 0.7 V bias voltage), relative to the sensitivity of −2 mV/°C.

These problems can be addressed by using two diodes, each driven by a different current source. The output signal is the difference between the voltages developed across the diodes. The turn-on voltages of the two diodes effectively cancel each other out, and the resulting relationship is linear between the output voltage and the temperature. This approach has other drawbacks. Due to mismatching of the diodes, a gain error can result—although this error can be quantified and eliminating by using a two point calibration. More significantly, an error can be caused by mismatched current sources and temperature coefficients. These errors can produce a nonlinearity in the measurement that can be significant.

To address the problem of mismatch errors, another approach is to use a square wave current source which provides current at two different levels. This single current source generates two different diode voltages that can be subtracted. When the current source output is at a first current level, a first output voltage is sampled and stored. When the current source is switched to a second current level, a second output voltage is sampled and subtracted from the first voltage. As a result, the measurement is independent of the sensor and the current source. In this case however, power supply noise is coupled directly into the measured signal. This situation is different from a differential circuit where such noise appears as a common mode signal and is rejected.

Other efforts have focused on techniques such as controlling currents independently, and use of temperature to frequency conversion with a thermistor to improve the measurement. As a result of these efforts, the best resolution known for an integrated circuit sensor without a thermistor has been about 0.01° C., which is nearly three times worse than the resolution attained with discrete, thermistor-based systems.

SUMMARY OF THE INVENTION

The invention features a circuit which has two sensors, an excitation source for providing an excitation signal to each sensor, and a control circuit coupled to the sensors for maintaining the excitation signal to each sensor at a fixed ratio.

Preferably, the excitation source is a current source with a mismatched transistor pair for providing the current in a fixed ratio. The transistors in the pair can be MOSFET's or bipolar. The sensors are preferably diodes, and can be used to sense and measure a parameter, such as temperature or light. Alternatively, the sensors could be radiation sensitive transistors or any other elements that can be excited with a fixed current ratio. The control circuit preferably has two current control elements and a feedback circuit. The current control elements are preferably diodes, but can also be resistors or transistors. The feedback circuit preferably includes a fully differential operational amplifier which receives voltage inputs from the current control elements, and provides an output to the gates or bases of the transistors in the differential pair. The operational amplifier preferably has chopper circuitry for reducing the low frequency noise and the input offset of the operational amplifier.

BRIEF DESCRIPTION OF THE DRAWINGS

Other features and advantages will become apparent from the following description of the preferred embodiments and from the claims when read in conjunction with the following drawings in which:

DESCRIPTION OF THE PREFERRED EMBODIMENTS

Figure 1:
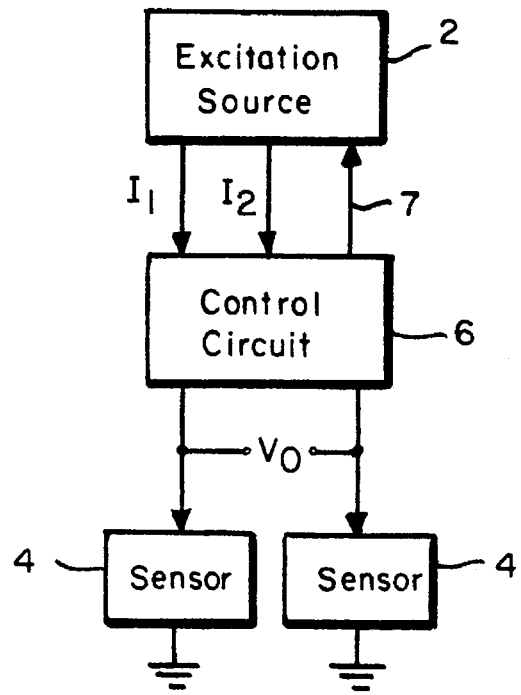
FIGS. 1 and 2 are block diagrams of a first and second embodiment of the present invention.
Figure 2:
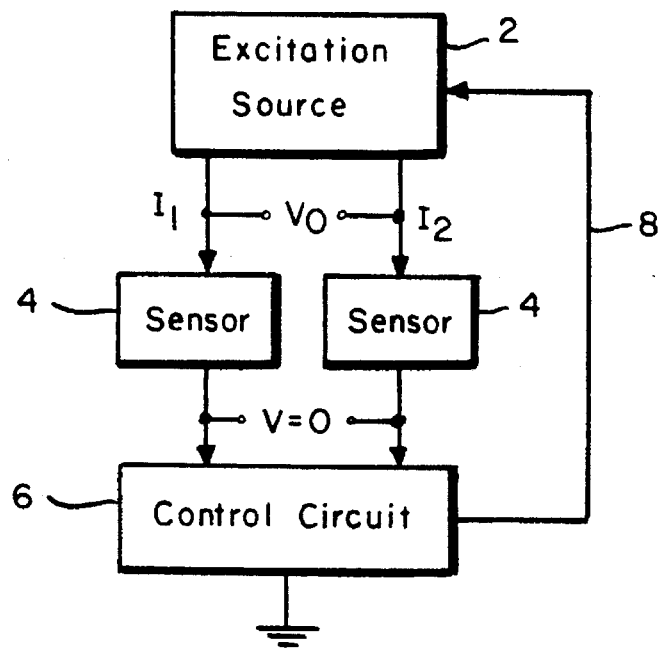

Referring generally to FIGS. 1 and 2, each circuit has an excitation source 2, a control circuit 6, and two sensors 4. The sensors are preferably matched diodes and are used, for example, to detect and measure temperature or light. The excitation source provides currents $I_1, I_2$ which are in a fixed ratio. A voltage $v_o$ is taken across the input terminals of the sensors to measure a parameter, such as temperature. If the sensors are diodes, a differential voltage signal will be linearly related to absolute temperature.

Control circuit 6 is coupled to the sensors at the sensors' input or output and provides a feedback signal 7, 8 to the excitation source for controlling the currents $I_1$, $I_2$ to maintain the fixed ratio. The feedback is provided by an operational amplifier which receives inputs from the input terminals or the output terminals of the control elements, and forces these received inputs to have a difference of zero.

Referring to FIG. 1, the first embodiment is referred to as the top loop arrangement. Control circuit 6 receives currents $I_1$ and $I_2$ in a fixed ratio 1:n from the excitation source, and provides these currents to each sensor. Circuit 6 also provides a feedback signal 7 to the excitation source to keep $I_1$ and $I_2$ at the fixed ratio. A voltage, $v_o$, is detected across the sensor inputs to measure temperature or some other parameter which is being sensed. As will be shown with equations below, given two known currents and matched diodes, the differential voltage across the input terminals will vary linearly with absolute temperature.

Referring to FIG. 2, in a bottom loop arrangement, currents $I_1$ and $I_2$ are provided directly to the sensors, and the voltage $v_o$ is measured across the inputs to the sensors. The current from each sensor is provided to the control circuit which feeds back signal 8 to the excitation source to maintain the ratio of the currents, while at the same time the control circuit holds the voltages at the inputs of the control circuit to an equal value.

Figure 3:
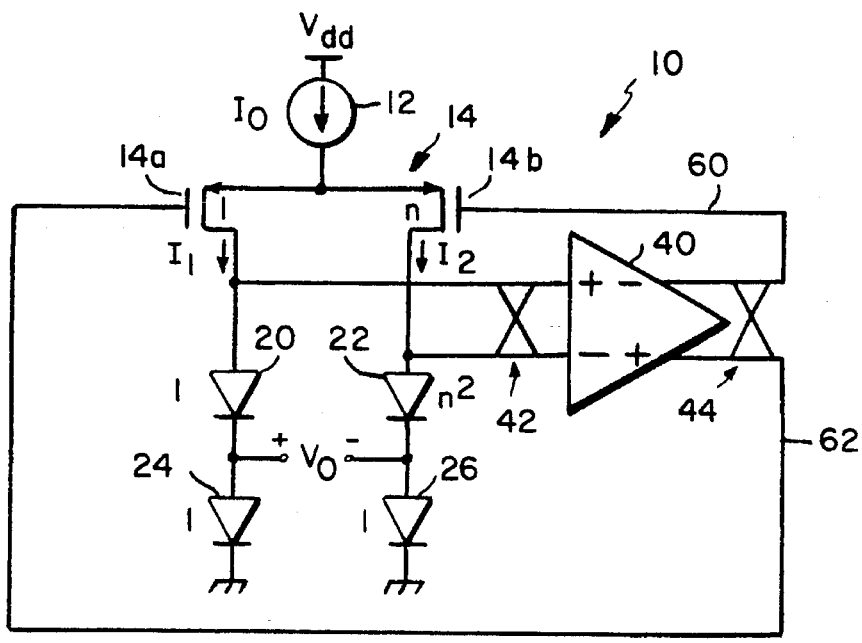
FIG. 3 is a schematic of the first embodiment of the present invention.

FIG. 3 is a more detailed schematic of the top loop embodiment. Circuit 10 has a single current source 12 which provides a current $I_o$ to a mismatched differential MOSFET pair 14 having MOSFET's 14a and 14b. The MOSFET pair provides two currents, $I_1$ and $I_2$, which are in a 1:n ratio. This ratio is obtained by making the MOSFET's similar except for the geometric ratio of the channel width to channel length in each MOSFET. The ratio of the geometric ratios of MOSFET 14a and the geometric ratio of MOSFET 14b is 1:n. In general, geometric parameters such as width and length are easy to control when the MOSFET's are fabricated. As an alternative to MOSFET's, bipolar transistors can be used as the differential pair, where the ratio of emitter areas is 1:n.

Currents $I_1$ and $I_2$ are provided to mismatched current control diodes 20, 22, which are in series with matching sensor diodes 24, 26. As discussed above, the output voltage $v_o$ represents the difference in the voltages across the two sensor diodes which are matched to provide a differential output. The current control diodes preferably have the same current density properties, but have different cross-sectional area to allow different currents at the fixed ratio. Sensor diodes 24, 26 and current control diode 20 can be produced to have matching characteristics, if desired, for simplicity.

Feedback signals 60, 62 are provided by a differential amplifier 40 with chopper circuitry 42, 44 to the gates of the MOSFET's 14a and 14b. The amplifier provides an output voltage to the gate of each MOSFET. The outputs are whatever voltages are needed to maintain the amplifier input voltages $v_+$ and $v_-$ such that $v_+ - v_- = 0$. As is generally known, by increasing the magnitude of the gate to source voltage of a MOSFET, the magnitude of the drain current is also increased. The average voltage output from the amplifier is constant, but the difference varies. Thus the amplifier controls the currents by changing the voltage difference provided to the gates of the MOSFET's.

The inputs to the amplifier are taken at the input to the current control diodes and are as follows:

$$v_+ = 2V_{TH} \ln (I_1/I_s)$$

$$v_- = V_{TH}\ln (I_2/I_s) + V_{TH}\ln (I_2/n^2 I_s).$$

In these equations, $V_{TH} = kT/q$, where T is absolute temperature, k is Boltzmann's constant, and q is the unit electronic charge are constants which are not dependent on temperature. $I_s$ is a saturation current, which is dependent on temperature. If $v_+ = v_-$, then it can be shown that $I_2/I_1 = n$. This equation indicates that the operational amplifier, in effect, provides whatever output is necessary to the MOSFET's to keep the ratio of the currents at the desired ratio.

The ratio between $I_2$ and $I_1$ is determined by a ratio of $n^2$ of the cross-sectional area of the diodes, a factor which can be accurately controlled during processing. If, due to normal process variation, an area mismatch results, the resulting ratio offset error can be easily calibrated, since only the slope of the voltage to temperature curve is modified. As a result, once the ratio is set, it is constant over temperature.

Consequently, the voltage across the two sensing elements, $v_o$, is linearly proportional to absolute temperature: i.e., $v_o = v_{D1} - v_{D2} = (V_{TH}) \ln (I_1/I_2) = (kT/q) \ln (I_1/I_2)$. Therefore, $T = (q/k) \ln (I_1/I_2) v_o$. Since q, k, and $I_1/I_2$ are constants which do not depend on temperature, $T = K v_o$, where K is a combined constant which is not temperature dependent. If calibration is necessary, K can be adjusted. Thus after calibration, by measuring $v_o$, absolute temperature can be determined with a simple calculation.

Figure 4:
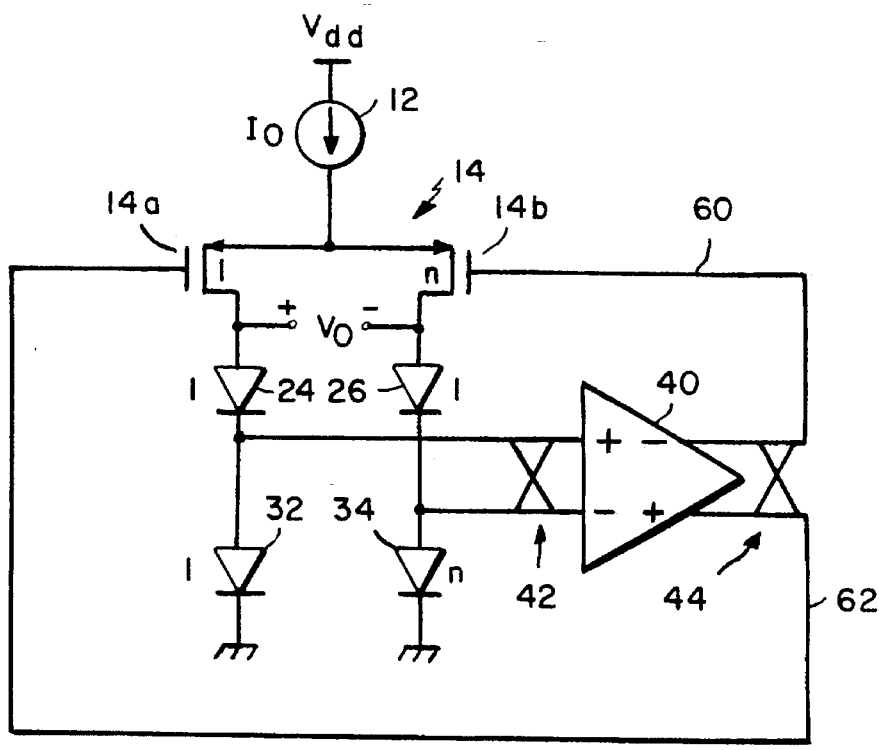
FIG. 4 is a schematic of the second embodiment of the present invention.

Referring to FIG. 4, in a bottom loop embodiment of the present invention, the current control diodes 32, 34, are grounded, and the currents are provided to sensor diodes 24, 26 directly from differential pair 14. The voltage inputs to the amplifier are taken at the input to current control diodes 32, 34 yielding $v_+ = v_- = V_{TH}\ln(I_1/I_s) = V_{TH} \ln (I_2/I_s)$. The same relationship between the currents, $I_2/I_1 = n$, holds. In this case, however, the ratio of the cross-sectional areas is n instead of $n^2$. To save chip area, the bottom loop embodiment is generally more desirable.

A typical n:1 ratio would be about 10:1 or 20:1. In general, a higher ratio provides a better differential signal, but also has a higher common mode signal. The selected ratios are somewhat arbitrary, since the circuitry should work over a wide range of ratios.

Other current control elements, such as resistors, can be used in place of diodes 20, 22 or 32, 34. Resistors with ratios of 10:1 or 20:1 would take up more space on a chip, and consequently are less favored. Also, a bipolar transistor or other field effect transistors could be used as current control elements.

Operational amplifiers generally have low frequency noise which can detract from the resolution of the measurement by the circuitry. Such noise generally is significant up to a certain frequency, e.g., about 1 khz, and then is negligible. In each circuit, the operational amplifier is provided with chopper circuitry, represented at 42, 44, to reduce the low frequency noise. An AC-coupled chopper amplifier circuit has a square wave oscillator which modulates a small DC signal to frequency levels where the noise is negligible. The higher frequency signal is amplified and demodulated. Consequently, the low frequency noise of the amplifier is reduced relative to the amplified signal. A typical amplifier also has an input offset error. Since the input offset is a zero-frequency component of the noise, it too is eliminated using this technique.

Figure 5:
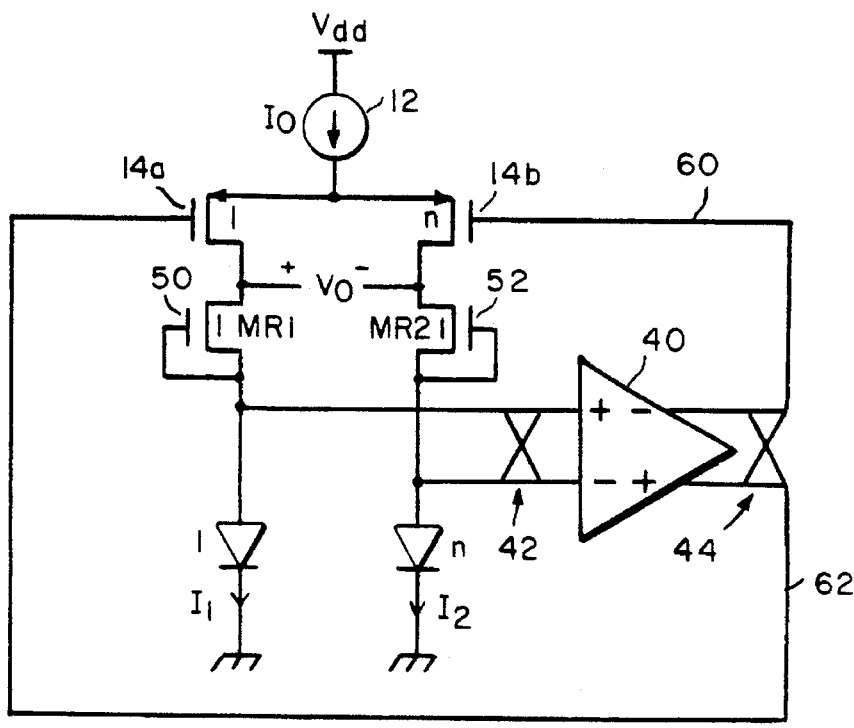
FIG. 5 is a schematic of a third embodiment of the present invention for sensing radiation.
Figure 6:
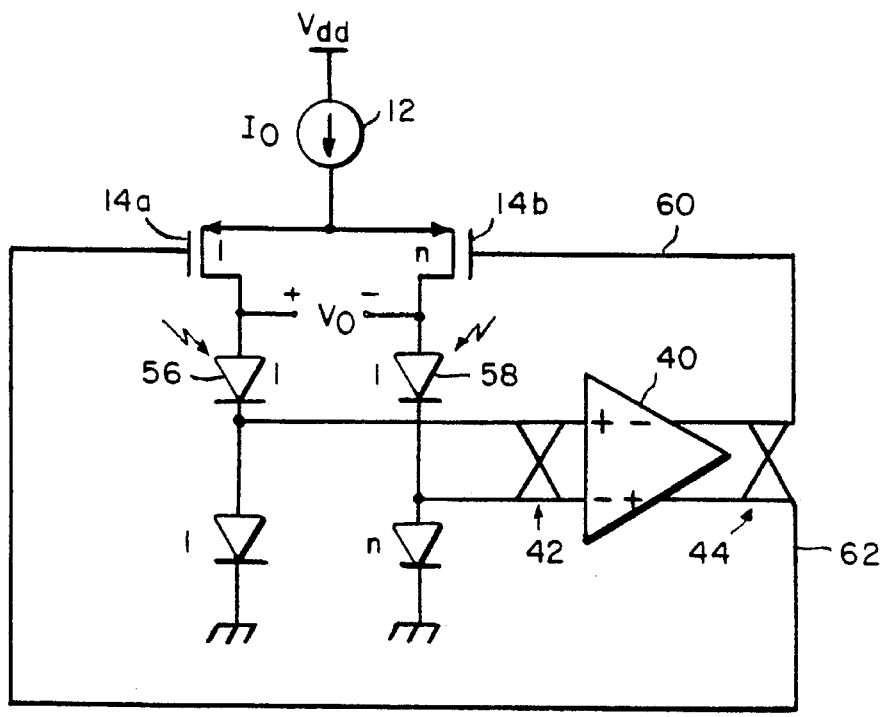
FIG. 6 is a schematic of a fourth embodiment of the present invention for sensing light.

The technique described above can be used for other types of sensors. Referring to FIG. 5, in a third embodiment, the sensing elements are radiation sensing field effect transistors (RADFETs) 50, 52. Referring to FIG. 6, in a fourth embodiment the sensors are photodetectors 56, 58. In each of these embodiments, a bottom loop arrangement is shown, but a top loop arrangement could also be used. In short, the techniques described here can be used with a variety of different sensing elements which require that fixed current ratio excitation, and need not necessarily be diodes.

The sensor circuitry according to the present invention can be fabricated on a single chip along with circuitry with some processing capabilities. Thus, the sensor according to the present invention has the advantages of being small and easily fabricated, while still having high resolution due to low noise and due to avoiding the problems of a mismatched excitation source.

Having described a number of preferred embodiments of the present invention, it will become apparent to those skilled in the art that other modifications can be employed without departing from the scope of the present invention as defined by the appended claims.

What is claimed is:

1. A circuit comprising:

two sensor;

an excitation source having a separate excitation control element for providing an excitation signal to each sensor, said excitation signals being at a fixed ratio for at least one of their characteristics;

a control circuit coupled to the sensors for maintaining the excitation signals at the fixed ratio regardless of temperature changes, said control circuit including a feedback network for providing a separate feedback signal to each of said excitation control elements; and output terminals for obtaining a signal from said sensors indicative of a selected sensed parameter.

2. The circuit of claim 1 wherein the control circuit further comprises:

two current control elements, each of which has an input terminal, and each of which is coupled to a respective sensor of said two sensors; and a feedback network coupled to the input terminal of each current control element, for feeding back a signal to the excitation source to maintain the excitation signals at the fixed ratio.

3. The circuit of claim 2 wherein the two sensors each has an input terminal coupled to a respective output of the current control elements, and an output terminal of said each sensor is grounded.

4. The circuit of claim 2 wherein the two sensors each has an output terminal coupled to the respective input of the current control elements, the outputs of the current control elements being grounded.

5. The circuit of claim 2 wherein the feedback network comprises an operational amplifier.

6. The circuit of claim 5 wherein the feedback network further comprises chopper circuitry for modulating the input to the amplifier, and for demodulating the output.

7. The circuit of claim 6 wherein the excitation source is a current source and the excitation control elements include a differential transistor pair for providing currents at the fixed ration.

8. The circuit of claim 7 wherein outputs of the operational amplifier are respectively coupled to control inputs of the transistors in the differential pair.

9. The circuit of claim 8 wherein the sensors comprise diodes.

10. The circuit of claim 9 wherein the current control elements comprise diodes.

11. The circuit of claim 10 wherein the sensors are matched diodes, and the control elements pass current at the fixed ratio.

12. The circuit of claim 10 wherein the sensors are used to measure temperature.

13. The circuit of claim 1 wherein the two sensors each have input terminals coupled to the control circuit, and output terminals which are grounded.

14. The circuit of claim 1 wherein the control circuit comprises two current control elements, each coupled in series with respective sensor of said two sensors, and wherein the two sensors each have output terminals coupled to the current control elements, the current control elements being grounded.

15. The circuit of claim 1 wherein the excitation source comprises a current source and a differential transistor pair which provides currents to each sensor of said two sensors at the fixed ratio.

16. The circuit of claim 15 wherein the control circuit further comprises:

two current control elements, each of which has an input terminal, and each of which is coupled to a respective sensor of said two sensors; and the feedback network is coupled to the input terminal of each current control element, for feeding back a signal to both of the transistors in the differential transistor pair.

17. The circuit of claim 16 wherein the current control elements comprise diodes.

18. The circuit of claim 1 wherein the sensors are integrated silicon sensors fabricated on a chip.

19. The circuit of claim 1 wherein the sensors sense temperature.

20. The circuit of claim 1 wherein the sensors sense light.

21. The circuit of claim 1 wherein the sensors sense radiation.

22. The circuit of claim 1 wherein the circuit is fabricated on a single chip.

23. A circuit comprising:

a first sensor;

a first current control element coupled to the first sensor;

a second sensor;

a second current control element coupled to the second sensor;

current source circuitry for providing a first current and a second current having a selected ratio to the first and second sensors and to the first and second current control elements along first and second current paths;

feedback circuitry for receiving inputs from the first and second current paths and for providing separate outputs to the current source circuitry for the first and second currents respectively to maintain the first and second currents at the fixed ratio regardless of temperature changes; and output terminals for obtaining a signal from said sensors indicative of a selected sensed parameter.

24. The circuit of claim 23 wherein each sensor comprises a diode.

25. The circuit of claim 24 wherein the current source circuitry comprises:

a current source; and a mismatched differential transistor pair coupled to the output of the current source.

26. The circuit of claim 23 wherein the feedback circuitry comprises an operational amplifier and chopper circuitry for modulating the input to the amplifier and for demodulating the output from the amplifier.

27. The circuit of claim 23 wherein the sensor elements are sensitive to temperature.

28. The circuit of claim 23 wherein the sensor elements are sensitive to light.

29. The circuit of claim 23 wherein the sensor elements are sensitive to radiation.

30. The circuit of claim 23 wherein the first current control element and the first sensor are in series, and the second current control element and second sensor are in series, wherein the feedback circuit is coupled to inputs of the current control elements.

31. The circuit of claim 30 wherein the current source circuitry comprises:

a current source; and a mismatched differential transistor pair coupled to the output of the current source.

32. The circuit of claim 31 wherein the feedback circuit is an operational amplifier which has an output coupled to the differential transistor pair.

33. The circuit of claim 32 wherein sensors are diodes.

34. The circuit of claim 23 wherein each sensor element is a diode;

each current control element is a diode;

the current source circuitry comprises a current source and a mismatched transistor pair for providing two currents at a fixed ratio, and the feedback circuitry comprises:

an operational amplifier for receiving voltage inputs at the inputs to the current control diodes and for providing outputs to the transistor pair; and chopper circuitry for modulating and demodulating the inputs and output to and from the operational amplifier.

35. A circuit comprising:

first means for sensing a parameter;

second means for sensing a parameter;

means for providing a first current and a second current to each of the first and second means for sensing, respectively, the first and second currents having a fixed ratio;

means for controlling the first and second currents to maintain the fixed ratio regardless of temperature changes, said means for controlling including a feedback network for providing a separate feedback signal to the means for providing for said first current and for said second current; and output terminals for obtaining a signal from said sensors indicative of the sensed parameter.

36. The circuit of claim 35 wherein the means for providing a first current and a second current comprises:

means for providing a source current; and means for dividing the source current in the fixed ratio.

37. The circuit of claim 36 wherein the feedback network feeds back a feedback signal to the means for dividing.

* * * * *